United States Patent [19]

Kazusaka et al.

[11] Patent Number: 5,247,291
[45] Date of Patent: Sep. 21, 1993

[54] DISPLAY WITH IMPROVED FRAME SURROUNDING DISPLAY ELEMENT

[75] Inventors: Shoji Kazusaka, Schaumburg, Ill.; Kouji Ohmori, Osaka; Sawako Ehara, Kyoto, both of Japan

[73] Assignee: Omron Tateisi Electronics Co., Kyoto, Japan

[21] Appl. No.: 434,135

[22] Filed: Nov. 13, 1989

[30] Foreign Application Priority Data

Nov. 14, 1988 [JP] Japan ............................... 63-287392
Nov. 25, 1988 [JP] Japan ............................... 63-153868

[51] Int. Cl.⁵ ............................................. G08G 5/00
[52] U.S. Cl. ........................... 340/815.2; 340/815.23; 345/46
[58] Field of Search ........... 340/815.2, 815.23, 815.12, 340/815.03, 762, 782; 361/395, 399, 424, 391; 362/367, 800

[56] References Cited

U.S. PATENT DOCUMENTS

| | | | |
|---|---|---|---|
| 3,631,299 | 12/1971 | Meyer et al. | 361/399 |
| 4,245,274 | 1/1981 | MacDonald et al. | 361/399 |
| 4,667,266 | 5/1987 | Masuoka et al. | 361/399 |
| 4,667,277 | 5/1987 | Hanchar | 362/800 |

FOREIGN PATENT DOCUMENTS

89/08908 9/1989 PCT Int'l Appl. ................. 340/784
2164189A 3/1986 United Kingdom ................. 40/552

*Primary Examiner*—Ulysses Weldon
*Attorney, Agent, or Firm*—Foley & Lardner

[57] ABSTRACT

Disclosed herein is a display to be applied to a digital switch. This display includes a casing (1) formed of a box-type casing (2) and a cover (3), a display element (8) facing a display window (2b) accommodated in the casing (1), a printed wiring board (9) for supporting the display element (8), and a printed wiring board (14) which is connected to the printed wiring board (9) and on which a control circuit (16) for displaying an external input signal on the display element (8), and the like are mounted. At the front portion of the casing (1) is formed frames 11a and 11b extending over a display face (8) of the display element (8), and thus a portion of the printed wiring board (9) which is located at the outer periphery of the display element (8) cannot be seen from the outside. A conductive pattern (18) for discharging a static electricity is provided on the printed wiring board (9), corresponding to a region in which the frames (11a, 11b) engaged with each other. The frames (11a, 11b) have adhesive tapered faces, and thus a static electricity is hard to enter the display from the outside. Thus, it flows out of the display through the conductive pattern (18) even if it enters the display.

9 Claims, 3 Drawing Sheets

DISPLAY WITH IMPROVED FRAME SURROUNDING DISPLAY ELEMENT

BACKGROUND OF THE INVENTION

1. Field of the Invention

The present invention relates generally to displays and, more particularly, to a display having an improved frame surrounding a display element.

2. Description of the Background Art

A display to be applied to a digital switch and the like comprises a display element for displaying numerals, a printed wiring board on which a circuit element for the display element is mounted, and a casing for accommodating the display element and the printed wiring board. A display window is provided in this casing, and the display element is provided in the casing with its display face facing the display window.

With a portion of a human body electrostatically charged with frictional electrification being in proximate to or in contact with such a display, when a charge enters through the display window to the inside of the casing, the circuit element mounted on the printed wiring board is liable to be destroyed by the charge. In order to protect the circuit element, in the display of the background art of the present invention, provision of a metal frame attached onto the periphery of the display window of the casing and further provision of a ground lead within the casing to contact this metal frame causes the charge, which entered in the display, to flow out of the display through the metal frame and the ground lead.

However, there were disadvantages of increases in the number of components and assemblies and in production cost since the metal frame is employed as described above. Further, it sometimes occurs that the metal frame is deformed by some external force in assembly of the display. Moreover, even if no abnormality occurs in the assembly of the display, a poor contact between the metal frame and the ground lead in use causes a charge to be stored in the display, leading to a fear of destruction of the circuit element.

In addition, the display of the background art of the present invention involves another disadvantage that due to a gap between the display window and the display element, even if a filter is attached to the display window, the printed wiring board located at the peripheral portion of the display element can be viewed through the filter, resulting in the unattractive display in appearance.

SUMMARY OF THE INVENTION

It is an object of the present invention to provide a display capable of achieving decreases in the number of components and assemblies and a high reliability.

It is another object of the present invention to provide a display with a good appearance.

A display according to the present invention comprises a casing including a side panel having an opening portion for a display window, a display element provided in the casing with its display face facing outside through the display window, and a board provided in the casing and including thereon an electrical circuit for allowing the display element to display. The side panel of the casing, enclosing the display element extends over the display face thereof. The side panel may be formed integrally with the casing. The casing may include a base member and a cover member in pair with the base member. The base member may include an engagement portion for engaging with the cover member. The cover member may include an engagement portion for engaging with the above engagement portion. These engagement portions may have tapered faces so as to be able to adhere to each other. Further, a conductive pattern for discharging a static electricity may be formed on the board provided in the casing, corresponding to a region engaging with the engagement portions or the tapered faces. In addition, the casing may include connecting means for connecting the casing to a casing of another display.

According to the present invention, since the side panel of the casing having the display window extends over the display face of the display element, no circuit or board for allowing the display element to display can be seen externally, resulting in a superior appearance of the display. Moreover, the integral formation of the side panel with the casing results in a simplified structure of the display.

Since the conductive pattern for discharging the static electricity is formed on the board, corresponding to a region in which the base and cover members forming the casing engage with each other, this display has a smaller number of components and assemblies than a display employing a metal frame and can be manufactured at lower cost. Further, few poor contacts of the conductive pattern allow provision of a display with enhanced reliability.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
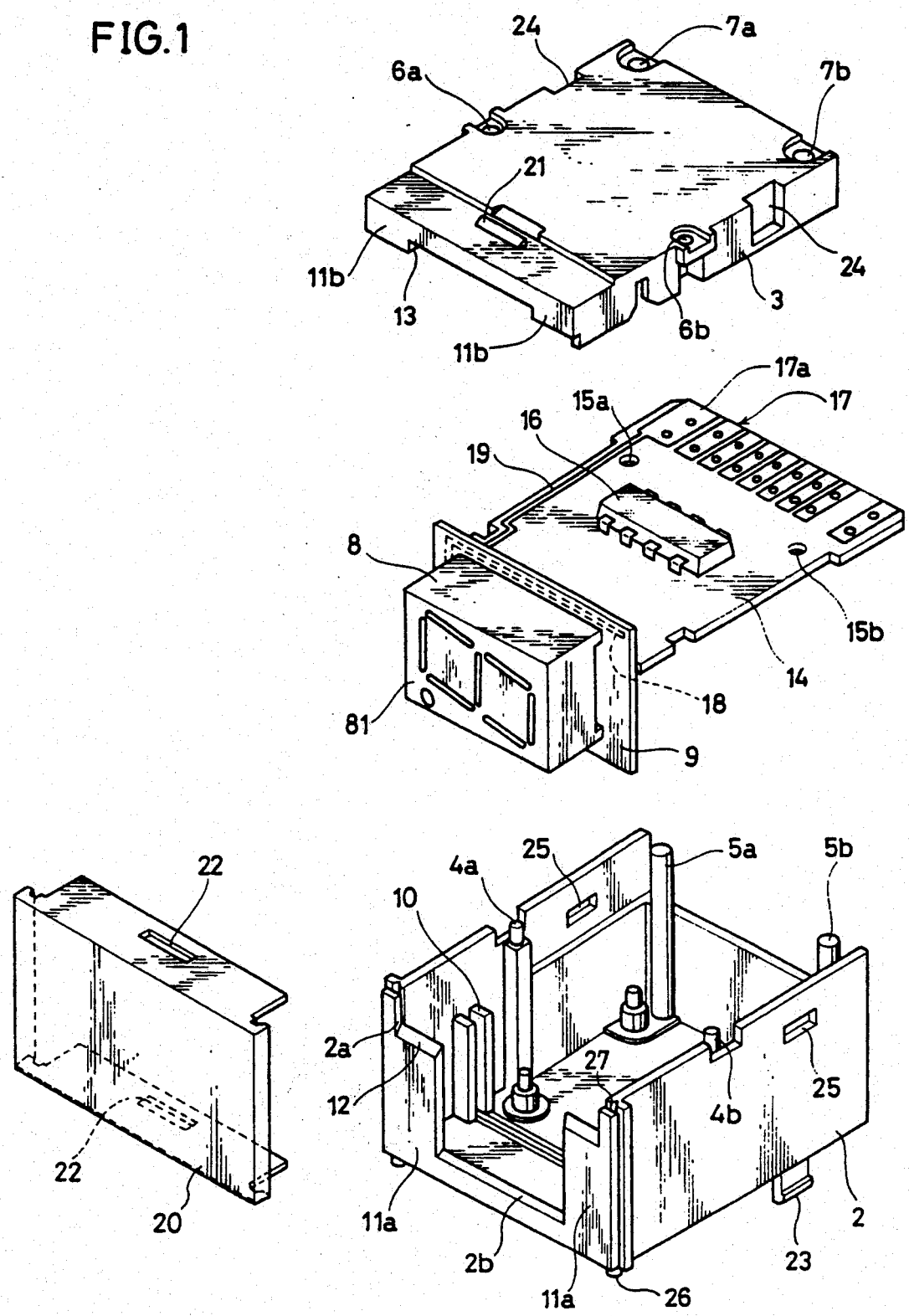
Fig. 1 is an exploded perspective view of a display of one embodiment of the present invention.
Figure 2:
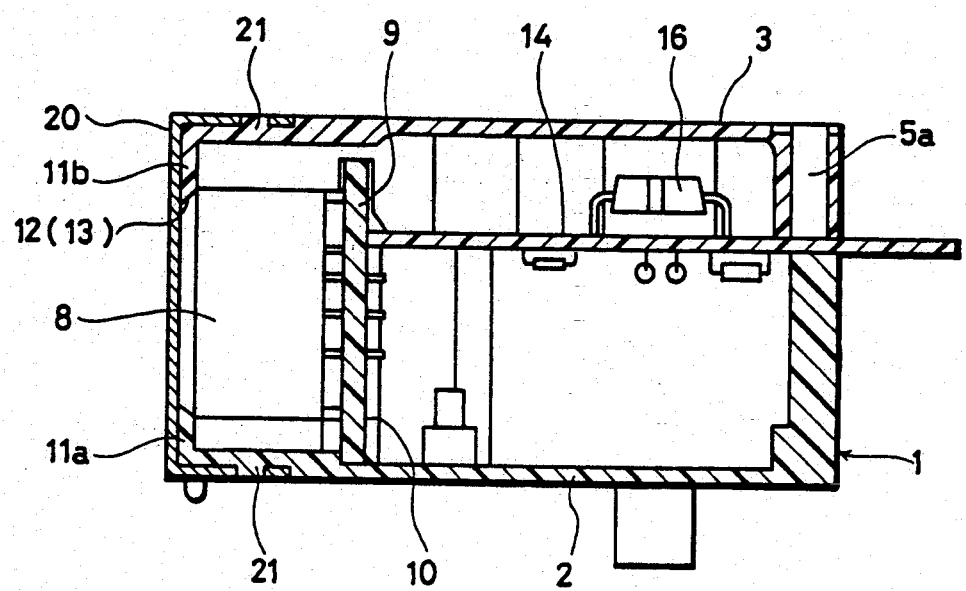
FIG. 2 is a sectional view of the display of one embodiment of the present invention.

Referring to FIGS. 1 and 2, a casing 1 made of synthetic resin comprises a box-type casing 2 which has an opening portion 2a at its front portion and has its upper portion released, and a cover 3 attached onto an upper portion of the box-type casing 2. Bosses 4a and 4b are provided in a central portion within the box-type casing 2, and bosses 5a and 5b are provided at its rear portion. Holes 6a and 6b are provided in the cover 3 corresponding to the bosses 4a and 4b, and holes 7a and 7b are provided corresponding to the bosses 5a and 5b. After a printed wiring board on which a display element (which will be described later) is mounted is attached to the box-type casing 2, the bosses 4a, 4b, 5a and 5b are fit respectively into the holes 6a, 6b, 7a and 7b of the cover 3, and then portions of the bosses are deformed or melted by heat. Accordingly, the cover 3 is fixed to the box-type casing 2.

The display element 8 has seven segments formed of light emitting diodes and is attached to the printed wiring board 9. The printed wiring board 9 is inserted into a guide 10 formed in the box-type casing 2. When the printed wiring board 9 is inserted into the guide 10, a display face 81 of the display element 8 faces a display window 2b stretching to the opening portion 2a. A frame 11a integrally formed with the box-type casing 2 is provided at the front face of the box-type casing 2, and a frame 11b integrally formed with the cover 3 is provided at the front face of the cover 3. The frames 11a and 11b define the display window 2b. A tapered end face 12 is formed at an upper end of the frame 11a, and a tapered end face 13 corresponding to the end face 12 is formed at a lower end of the frame 11b. When the cover 3 is attached to the box-type casing 2, the end face 12 of the frame 11a is adhered to the end face 13 of the frame 11b, as shown in FIG. 2.

A printed wiring board 14 is provided at a right angle to the printed wiring board 9. Circular holes 15a and 15b are formed at a rear portion of the printed wiring board 14. The bosses 5a and 5b are fit respectively in these circular holes 15a and 15b of the printed wiring board 14. Thus, the printed wiring board 14 is carried within the box-type casing 2. On the printed wiring board 14 is mounted a control circuit element 16 for displaying an external input signal on the display element 8, and the like, and is electrically connected to the printed wiring board 9. At the rear end portion of the printed wiring board 14 is formed a terminal pattern 17 for connecting the display to an external cable. The printed wiring boards 9 and 14 are mechanically connected by employing solder and the like.

Figure 3:
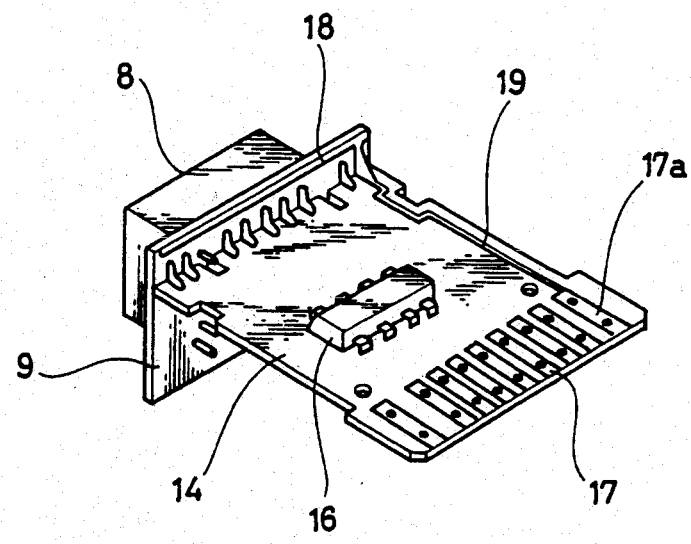
FIG. 3 is a perspective view of a printed wiring board constituting the display of one embodiment of the present invention.

Referring to FIGS. 1 and 3, a conductive pattern 18 for discharging a static electricity is formed at one side out of four sides of the printed wiring board 9, the side corresponding to the end faces 12 and 13 being fitting portions of the box-type casing 2 and the cover 3. The conductive pattern 18 and an earth terminal 17a included in the terminal pattern 17 are electrically connected to each other by a lead pattern 19 formed on the printed wiring board 14.

A colored filter member 20 is detachably fixed to the casing 1. Thus, as shown in FIG. 2, protrusions 21 are respectively formed on the box-type casing 2 and the cover 3, and holes 22 engageable with the protrusions 21 are formed in the colored filter member 20.

Figure 4:
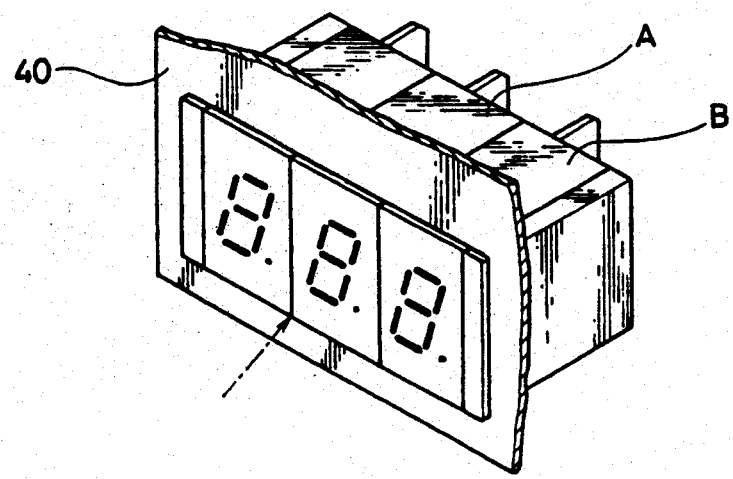
FIG. 4 is a perspective view illustrating a path for a static electricity to enter in the display to which the present invention is applied.

Projection pieces 23 and protruding portions 26 are formed at the lower part of the box-type casing 2, and holes 25 and 27 are formed at their respective upper portions. Holes 24 are formed in the cover 3 corresponding to the holes 25. In case of using a plurality of displays connected as shown in FIG. 4, the protruding portions 26 formed on the box-type casing 2 of a display A are inserted into the holes 27 formed in the box-type casing 2 of an adjacent display B. Thus, these displays are positioned. The projection pieces 23 of the display A engage from the inside with the holes 25 of the box-type casing 2 of the display B through the holes 24 formed in the cover 3. As a result, the displays A and B are connected.

In the display structured as above, when an external input signal is accepted in the printed wiring board 14 through the terminal pattern 17, a circuit provided on the printed wiring board 14 causes the display element 8 mounted on the printed wiring board 9 to be driven, and then the input signal is displayed by the 7-segment light emitting element. A display of the display element 8 is externally viewed through the display window 2b.

The display element 8 is enclosed by the frames 11a and 11b, as shown in FIG. 2, and thus the printed wiring board 9 in the casing 1 cannot be seen from the outside through the filter member 20. Therefore, the display can retain a good appearance in design. In addition, the frames 11a and 11b are integrally formed with the box-type casing 2 and the cover 3, respectively, resulting in a decrease in the number of components and a simplification in structure, compared to the case that the frames 11a and 11b are formed separately from the box-type casing 2 and the cover 3. Further, it is also possible to attach a rating plate for displaying the standard of the display, and the like onto the frames 11a and 11b. Next, a description will be given on a path for a charge to enter and a path for discharge in case that a portion of a human body electrostatically charged is in proximate to or in contact with the display in use.

In using the plurality of connected displays mounted on a panel 40 such as of a control board, as shown in Fig. 4, a charge of the human body enters through gaps between the displays into the casing 1 through the end faces 12 and 13 being the fitting portions of the box-type casing 2 and the cover 3 as shown by the chain dotted arrow. This charge is discharged to the outside through the conductive pattern 18, the lead pattern 19 and the earth terminal 17a. Therefore, the circuits on the printed wiring boards 9 and 14 are protected from a static electricity, thus retaining a suitable operation. The static electricity, as described above, passes through the end faces 12 and 13 of the frames 11a and 11b and enters in the casing 1. Locating the discharge pattern 18 on this entry path ensures that the charge flows into the discharge pattern 18 and then flows out of the display.

Since the end faces 12 and 13 are adhered to each other, the charge is hard to enter the casing 1. When the display is employed alone, the charge enters between the display and the panel. Since the path after the entry of the charge is the same as in the above case, the description will not be repeated.

Figure 5:
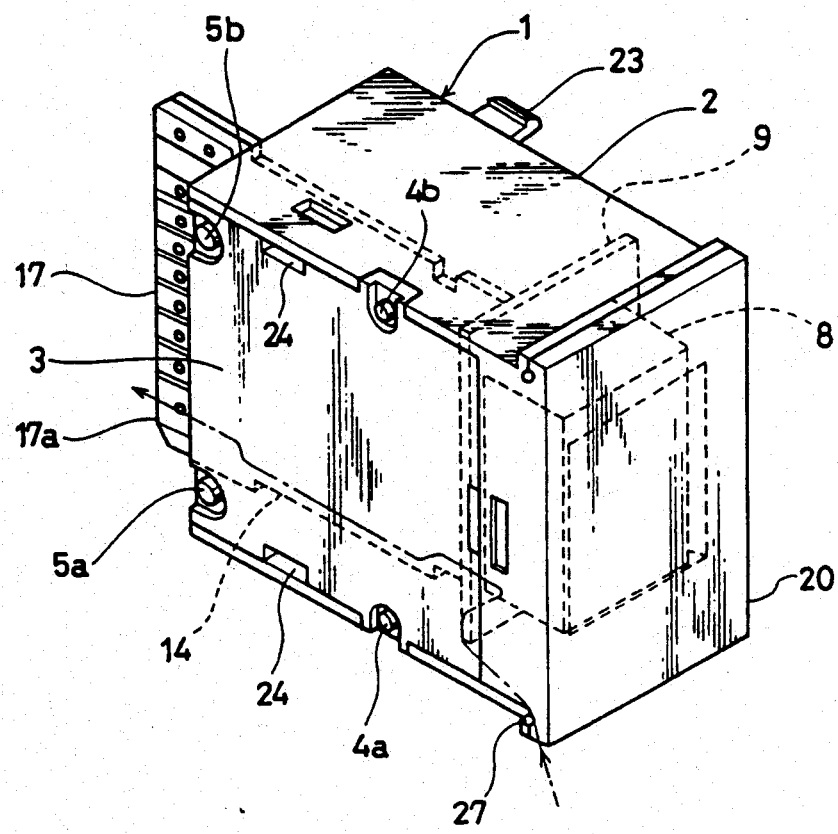
FIG. 5 is a perspective view illustrating another path for a static electricity to enter and to be discharged, different from the one shown in FIG. 4.

FIG. 5 shows another path different from the one in the above described case. Referring to FIG. 5, a charge enters through the holes 27 and their peripheries provided in the box-type casing 2 and reaches the printed wiring board 9, passing through the side face of the guide 10. Also in this case, the charge flows out of the display through the conductive pattern 18 provided in most proximate to the holes 27, and hence does not affect the circuit.

While the configuration of the above described conductive pattern 18 is one example, any configuration which can flow the charge entering the casing 1 may be substituted for the conductive pattern 18.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A display comprising:
  a casing including a side panel having an opening portion for a display window, a base member and a cover member;

a display element having a display face and provided in said casing so that said display face faces outward through said opening portion of said casing;

a wiring board enclosed in said casing and including thereon an electrical circuit for allowing said display element to display;

wherein said side panel of said casing extends over said display face, thereby enclosing said display element;

wherein said wiring board further comprises a first printed wiring board which is attached to the display element and a second printed wiring board having an end which is most distal relative to said display face, and being connected at a right angle to said first printed wiring board, said end having a terminal pattern thereon which can be connected to an external device; and wherein said base member and said cover member enclose said display element and said first and second printed wiring boards whereby said terminal pattern extends out of said casing.

2. A display in accordance with claim 1, wherein said side panel of said casing is integrally formed with said casing.

3. A display in accordance with claim 1, wherein said base member comprises an engagement portion for engaging with said cover member;

said cover member comprises an engagement portion for engaging with said engagement portion of said base member; and said wiring board comprises a conductive pattern for discharging a static electricity which is formed corresponding to a region in which said engagement portion of said base member engages with said engagement portion of said cover member.

4. A display in accordance with claim 3, wherein said side panel comprises a first portion and a second portion; and said engagement portions are provided at fitting portions of said first portion and said second portion of said side panel.

5. A display in accordance with claim 3, wherein said engagement portion of said base member has an inclined face inclining at a predetermined angle; and said engagement portion of said cover member has an inclined face which can adhere to the inclined face of said base member.

6. A display in accordance with claim 1, wherein said casing comprises connecting means for connecting said display to another display.

7. A display according to claim 1, wherein said first printed wiring board has a conductive pattern for discharging a static electricity which is formed to correspond to a region in which an engagement portion of said base member engages an engagement portion of said cover member;

said second printed wiring board has a lead pattern formed thereon which is electrically connected to said conductive pattern; and said terminal pattern has an earth terminal included thereon which is in communication with said lead pattern.

8. A display according to claim 1, wherein said first and second printed wiring boards are mounted perpendicular to each other.

9. A display according to claim 1, wherein said side panel of said casing extends over said display case such that said first and second printing wiring boards are to visible when said display face is viewed.

* * * * *